US007844937B2

(12) United States Patent
Raman et al.

(10) Patent No.: US 7,844,937 B2
(45) Date of Patent: Nov. 30, 2010

(54) METHOD AND APPARATUS FOR MAKING A SEMICONDUCTOR DEVICE USING HARDWARE DESCRIPTION HAVING MERGED FUNCTIONAL AND TEST LOGIC BLOCKS

(75) Inventors: Arvind Raman, Austin, TX (US); Ravi Gupta, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 438 days.

(21) Appl. No.: 11/951,558

(22) Filed: Dec. 6, 2007

(65) Prior Publication Data

US 2009/0150843 A1 Jun. 11, 2009

(51) Int. Cl.
*G06F 17/50* (2006.01)
(52) U.S. Cl. ...................................................... 716/18
(58) Field of Classification Search .................... 716/4, 716/16–18; 326/37–38
See application file for complete search history.

(56) References Cited

U.S. PATENT DOCUMENTS

| 6,256,770 | B1* | 7/2001 | Pierce et al. ................... 716/18 |
| 6,957,403 | B2* | 10/2005 | Wang et al. ..................... 716/3 |
| 7,139,991 | B2 | 11/2006 | Kretchmer et al. |
| 7,331,032 | B2* | 2/2008 | Wang et al. .................... 716/18 |
| 2003/0023941 | A1* | 1/2003 | Wang et al. ..................... 716/4 |
| 2005/0229123 | A1* | 10/2005 | Wang et al. ..................... 716/4 |
| 2005/0273683 | A1 | 12/2005 | Cote et al. |
| 2006/0271904 | A1* | 11/2006 | Emerson et al. ............... 716/18 |
| 2008/0005710 | A1* | 1/2008 | Fomaciari et al. .............. 716/6 |
| 2008/0189671 | A1* | 8/2008 | Habib et al. ................... 716/18 |

OTHER PUBLICATIONS

U.S. Appl. No. 11/678,258, filed Feb. 23, 2007.

\* cited by examiner

*Primary Examiner*—Stacy A Whitmore
(74) *Attorney, Agent, or Firm*—Joanna G. Chiu

(57) ABSTRACT

A processor-implemented method for making a semiconductor device having a test logic block and a functional logic block is provided. The method includes retrieving hardware description for at least one test logic block and mapping the hardware description for the at least one test logic block to logic gates to generate at least one synthesized test logic block. The method further comprises retrieving hardware description for at least one functional logic block and mapping the hardware description for the at least one functional logic block to logic gates to generate at least one synthesized functional logic block. The method further includes merging the at least one synthesized test logic block with the at least one synthesized functional logic block when the at least one functional logic block meets at least one criterion for selection as a candidate for merger with the at least one test logic block.

17 Claims, 4 Drawing Sheets

METHOD AND APPARATUS FOR MAKING A SEMICONDUCTOR DEVICE USING HARDWARE DESCRIPTION HAVING MERGED FUNCTIONAL AND TEST LOGIC BLOCKS

BACKGROUND

1. Field

This disclosure relates generally to semiconductor devices, and more specifically, to making a semiconductor device using a hardware description having merged functional and test logic blocks.

2. Related Art

In many devices, there exists both test logic and functional logic. The test logic may be any logic which tests the functional logic of the device, and may include built-in test logic such as memory built-in self test (MBIST) and logic built-in self test (LBIST). The functional logic is the logic outside of the test logic which implements the intended functionality of the device. Currently, the test logic is synthesized separately from the functional logic using dedicated logic for test-only purposes. However, as designs increase in complexity, the test logic necessary to cover these designs increases in complexity, thus resulting in increased die area consumed by the test logic. This increased die area works against the goal of achieving smaller devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As discussed above, as device complexities increase, the test logic for a device is consuming larger die area, which is typically undesirable. However, in many cases, the test logic, such as MBIST and LBIST, is orthogonal to the functional logic with the exception of the functional logic being tested. Furthermore, the test logic may be created for manufacturing test coverage, where once manufacturing testing is complete, this test logic remains completely idle during the functional application of the device. Therefore, in recognizing that test logic and functional logic are, in many cases, mutually exclusive, one embodiment discussed herein allows for the generation of merged logic blocks in which sequential elements in a functional logic block can be shared with sequential elements in a test logic block. This may be performed, for example, by an Electronic Design Automation (EDA) tool such that the resulting hardware description of a device includes merged functional and test logic blocks. This hardware description may then be used to manufacture a semiconductor device having merged functional and test logic blocks and resulting in reduced die area as compared to a semiconductor device in which functional and test logic blocks are not merged.

Figure 1:
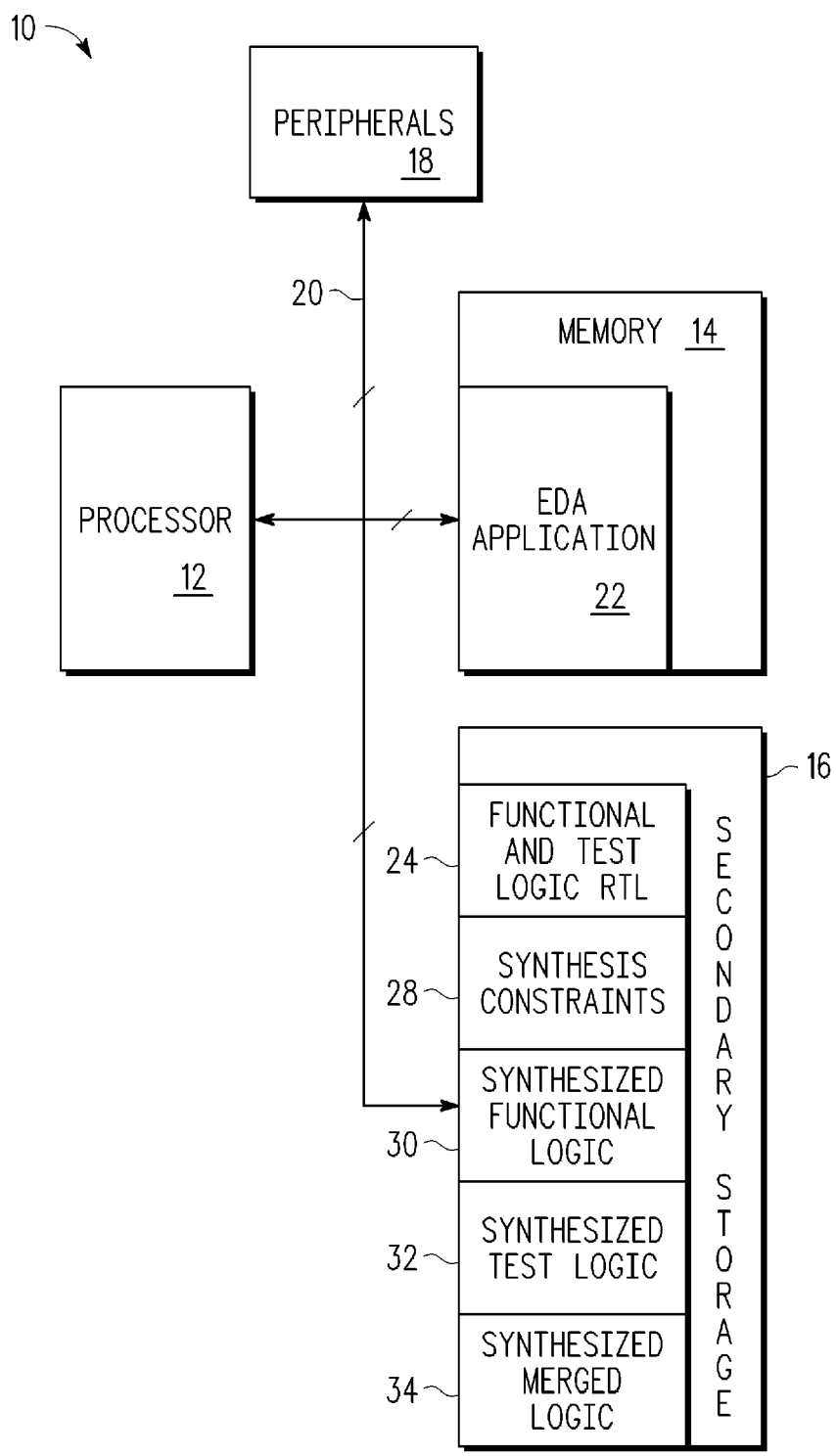
FIG. 1 illustrates, in block diagram form, a data processing system for executing an Electronic Design Automation (EDA) application in accordance with one embodiment of the present invention.

FIG. 1 illustrates a data processing system 10 capable of executing an EDA application. Data processing system 10 includes a processor 12, peripherals 18, a memory 14, and a secondary storage 16, all coupled via a system bus 20. Processor 12 can be any type of processor and is capable of executing software stored in memory 14. For example, memory 14 may store an EDA application 22 capable of execution by processor 12. Memory 14 may be, for example, any type of random access memory (RAM). Secondary storage 16 may be any type of storage, such as a hard drive or the like, used to store, for example, databases such as a functional and test logic Register Transfer Level (RTL) 24, synthesized functional logic 30, synthesized test logic 32, and synthesized merged logic 34. Secondary storage 16 may also store other information such as, for example, synthesis constraints 28. During execution of EDA application 22, processor 12 may access the information stored in secondary storage 16. Also, note that in alternate embodiments, any number of memories (such as RAMs or read only memories (ROMs)) and secondary storage units may be present on bus 20, where EDA application 22 may be stored in any other memory or may be distributed among different memories or even among different data processing systems. Similarly, data processing system 10 may include any number of secondary storage units where the information stored in secondary storage 16 may be stored in a different secondary storage unit or distributed among different storage units or even among different data processing systems.

Data processing system 10 operates as known in the art to execute EDA application 22. In one embodiment, data processing system 10 is a general data processor which may execute a variety of different applications, each of which may be stored in a memory coupled to processor 12, such as memory 14.

Figure 2:
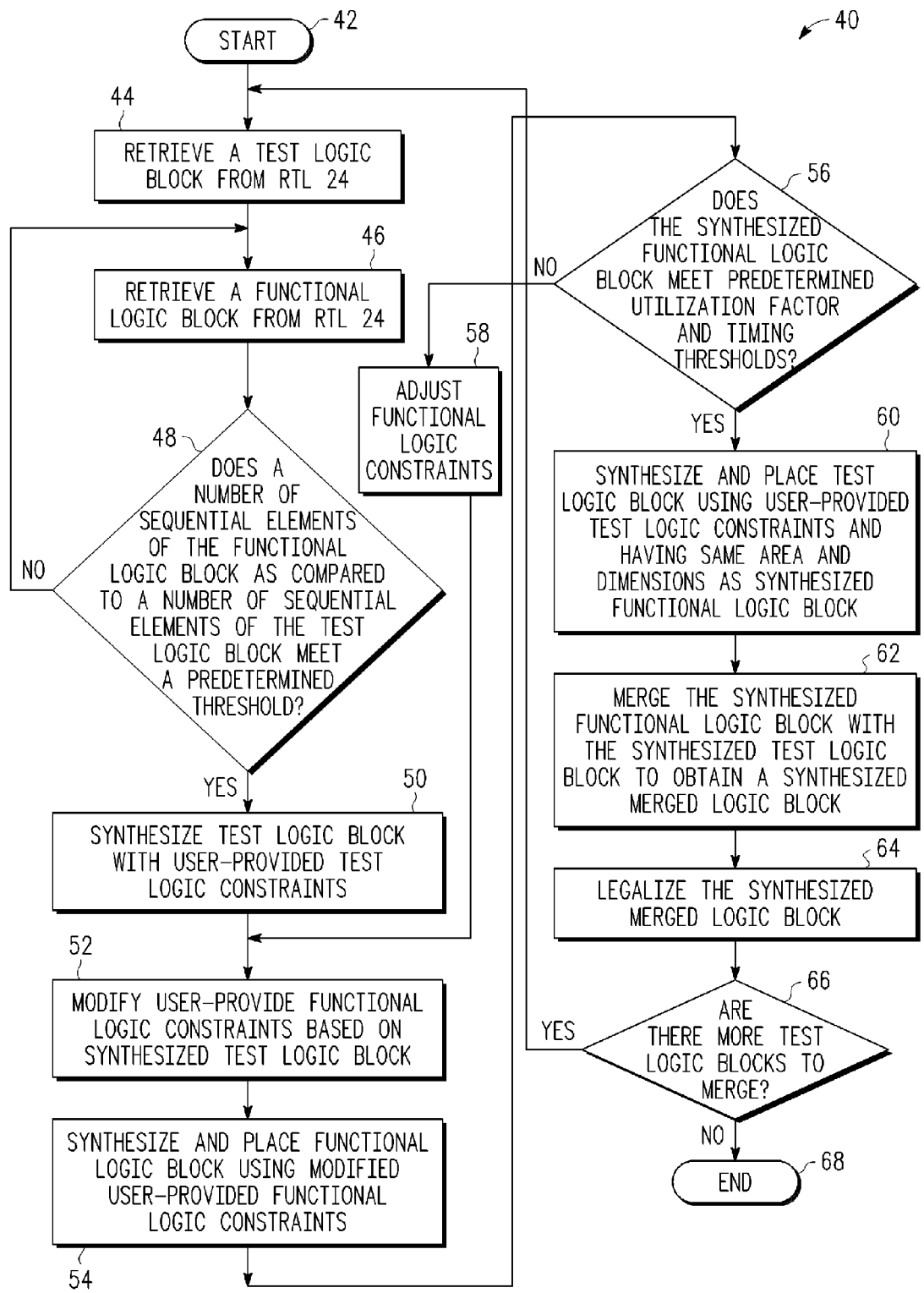
FIGS. 2 and 3 illustrate, in flow diagram form, operation of the EDA Application of FIG. 1 in accordance with one embodiment of the present invention.

FIG. 2 illustrates a flow 40 which may represent operations of EDA application 22 when implemented by processor 12. Flow 40 may be used to determine whether a test logic block and a functional logic block are candidates for being merged with each other, and if so, flow 40 merges the two blocks to form a merged synthesized block. Flow 40 begins with start 42 and proceeds to block 44 where a test logic block is retrieved from functional and test logic RTL 24. Flow then proceeds to block 46 where a functional logic block is retrieved from functional and test logic RTL 24. Note that functional and test logic RTL 24 may provide a hardware description for at least a portion of a device being designed, where the portion may include both functional logic and test logic. Furthermore, functional and test logic RTL 24 is organized in blocks, where a block is a synthesizable module of the design. For the discussions herein, each block of functional and test logic RTL 24 can be classified as being either a functional logic block or a test logic block. As discussed above, these functional logic blocks and test logic blocks are, in many cases, mutually exclusive.

Figure 4:
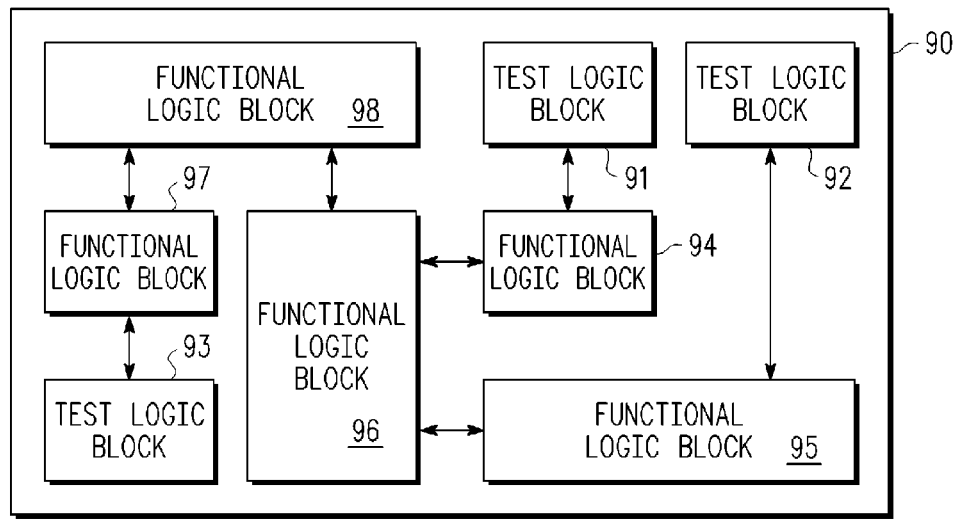
FIG. 4 illustrates, in block diagram form, a device in accordance with one embodiment of the present invention.

For example, functional and test logic RTL 24 can describe all or a portion of semiconductor device 90 of FIG. 4. As illustrated in FIG. 4, semiconductor device 90 includes a plurality of test logic blocks 91-93 and a plurality of functional logic blocks 94-98. Note that each of test logic blocks 91-93 of FIG. 4 takes additional space on the floorplan of device 90. Therefore, it may be desirable to try and merge some of the test logic blocks with the functional logic blocks so that, for example, logical resources can be shared. In one embodiment, a test logic block is selected first, and then candidate functional logic blocks are selected in turn until a functional logic block with which the selected test logic block can be merged is identified. Note that most test logic blocks are orthogonal to the functional blocks; however, not all functional blocks make good candidates for merging with the selected test logic block. Referring to test logic block 91 of FIG. 4, note that it is there for testing functional logic block 94; therefore, functional logic block 94 would not be a candidate for merging with test logic block 91. However, other nearby surrounding functional logic blocks, such as functional logic blocks 95-98 may be good merging candidates for test block 91. Similarly, for test logic block 92, functional logic blocks 94 and 96-98 may provide good merging candidates, while functional logic block 95 may not. Once candidate functional logic blocks are selected for a particular test block, it is determined whether a merging can be performed. Note that many different methods may be used for selecting the order in which test blocks will be merged (i.e. which test logic block will be retrieved in block 44 of FIG. 2) and for selecting which functional logic blocks will be used as candidates for merging with the selected test block and in what order they will be evaluated for merging (i.e. which functional logic block will be retrieved in block 46 of FIG. 2).

Therefore, referring back to FIG. 2, once a test logic block is selected in block 44 and a candidate functional logic block is selected in block 46, it will be determined whether the test logic block is capable of being merged with the candidate functional logic block. Therefore, flow proceeds from block 46 to decision diamond 48 where it is first determined whether a number of sequential elements of the selected candidate functional logic block as compared to a number of sequential elements of the selected test logic block meets a predetermined threshold. That is, in order to be merged and share the sequential elements, a functional logic block should have at least the same number of sequential elements as the test logic block with which it will be merged. In one embodiment, the predetermined threshold can be selected such that the functional logic block has to have a particular number of sequential elements more than the sequential elements of the test logic block.

Figure 5:
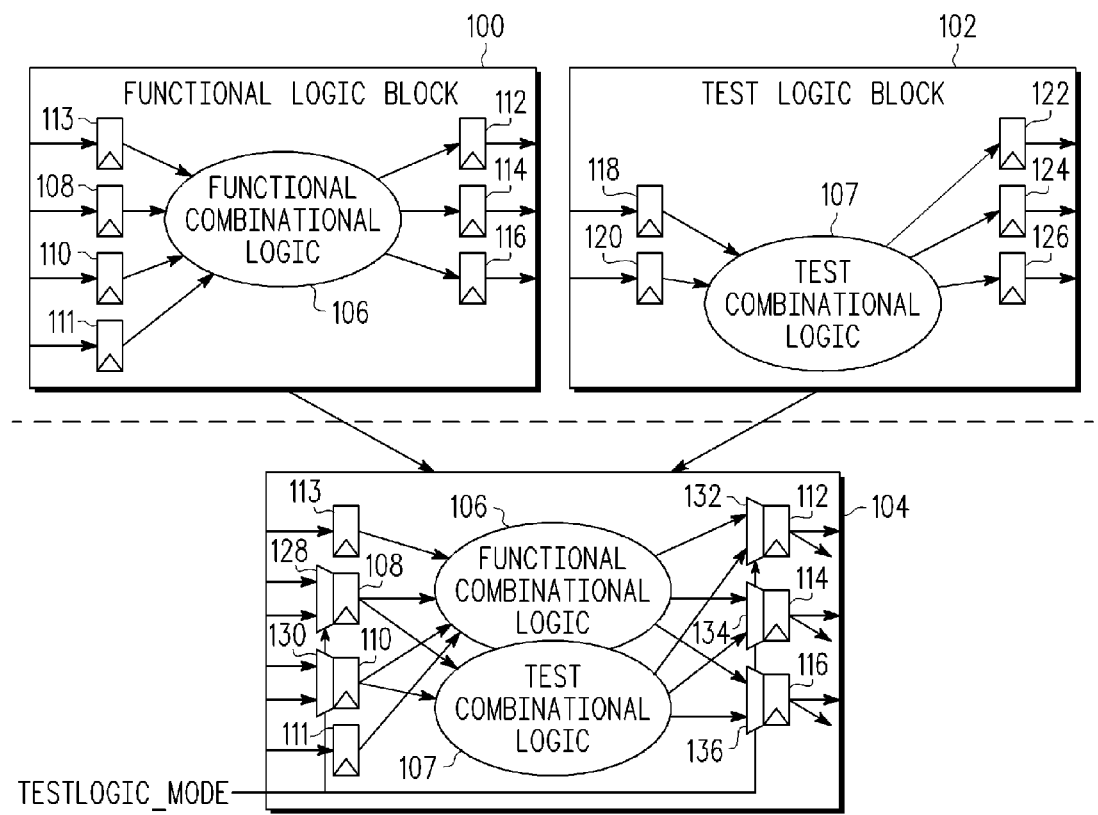
FIG. 5 illustrates, in block diagram form, a functional logic block, a test logic block, and a merged functional and test logic block, in accordance with one embodiment of the present invention.

For example, FIG. 5 illustrates an example functional logic block 100 and an example test logic block 102. Functional logic block 100 includes a plurality of sequential elements 113, 108, 110, and 111 which provide inputs to functional combinational logic 106. Functional logic block 100 also includes a plurality of sequential elements 112, 114, and 116 which, on each clock, stores outputs of functional combinational logic. Similarly, test logic block 102 includes a plurality of sequential elements 118 and 120 which provide inputs to test combinational logic 107. Test logic block 102 also includes a plurality of sequential elements 122, 124, and 126 which, on each clock, stores outputs of functional combinational logic. Each of functional logic blocks 100 and 102 can be represented in RTL in functional and test logic RTL 24. In one embodiment, functional logic block 100 may correspond to one of functional logic blocks 94-98 of device 90 and test logic block 102 may correspond to one of test logic blocks 91-93 of device 90. FIG. 5 also illustrates a merged functional and test logic block 104 which will be generated by flow 40 and will be described in more detail below. In order for functional logic block 100 and test logic block 102 to be merged, though, functional logic block 100 needs to have at least as many sequential elements as test logic block 102, Note that the sequential elements of FIG. 5 can be implemented with any type of clocked storage device such as flip-flops, latches, registers, etc.

Referring back to FIG. 2, if it is determined that a number of sequential elements of the candidate functional logic block as compared to the test logic block does not meet the predetermined threshold, flow proceeds back to block 46 where another functional logic block is retrieved. That is, another functional logic block is selected as a candidate functional logic block for merging with the test block retrieved in block 44. If, at decision diamond 49, it is determined that the predetermined threshold is met, flow proceeds to block 50 where the test logic block is synthesized with user-provided test logic constraints. These constraints may be stored, for example, as part of the synthesis constraints 28. Synthesis maps the RTL description (i.e. the hardware description) to logic gates of a particular technology, such as, for example, complementary metal oxide semiconductor (CMOS) technology. This mapping may be done based on user-provided test logic constraints which may include timing and area constraints. Note that other constraints may be provided, if needed. Also, note that currently known methods may be used to perform the synthesis (i.e. mapping) of a logic block.

After block 50, flow proceeds to block 52 where user-provided functional logic constraints (to be used for synthesizing the functional logic block) may be modified based on the synthesized test logic block. These user-provided functional logic constraints and their modifications may be also be stored as part of synthesis constraints 28. Note that the initial user-provided functional logic constraints (prior to modification) provides timing and area constraints for the candidate functional logic block. However, after synthesis of the test logic block, these user-provided functional logic constraints can be modified, for example, to add the area of the synthesized test logic block to the area constraint of the user-provided functional logic constraints. In this manner, more accurate user-provided functional logic constraints may be provided for the subsequent synthesis of the functional logic block.

After block 52, flow proceeds to block 54 where the selected functional logic block is synthesized and placed using the modified user-provided functional logic constraints determined in block 52. Note that the resulting synthesized functional logic block may provide a more accurate result due the modification of the user-provided functional logic constraints based on the synthesis of the test logic block. Again, synthesis maps the RTL description (i.e. hardware description) of the functional logic block to logic gates of a particular technology. This mapping may be done based on user-provided functional logic constraints, such as the modified user-provided functional logic constraints. Placing the synthesized functional logic block refers to determining the physical placement within the semiconductor device (e.g. the physical placement in silicon) of the logic gates of the synthesized functional logic block. This placing operation may result in physical coordinates being stored for each logic gate and sequential element of the synthesized functional logic block, where the coordinates may be stored, for example, in secondary storage 16. Note that currently known methods may be used to perform the physical placement of the logic gates.

After block 54, flow proceeds to decision diamond 56 where it is determined if the synthesized functional logic block meets predetermined utilization factor and timing thresholds. For example, the utilization factor refers to the density of logic gates in a given area. In order for the test logic block to be merged with the functional logic block, not only should there be sufficient sequential elements in the functional logic block, as was described above, but there should be enough room (enough congestion slack) to accommodate the test combinational logic and the additional multiplexers and enough timing slack to accommodate the additional multiplexers in the timing paths. For example, referring to FIG. 5, note that in merged block 104, multiplexers are added to the inputs of sequential elements 118, 110, 112, 114, and 116 in order to allow these sequential elements to be shared between functional combinational logic 106 and test combinational logic 107.

At decision diamond 56, if the utilization factor and timing thresholds are not met, flow proceeds to block 58 where the initial functional logic constraints are adjusted in an effort to meet the utilization factor and timing thresholds, and flow returns to block 52 where these adjusted functional logic constraints may again be modified to take into account the knowledge gained from the synthesized test logic block (such as by adding the synthesized test logic area). If at decision diamond 56, the thresholds are met, flow proceeds to block 60 where the test logic block is synthesized and placed using user-provided test logic constraints and having the same area and dimensions as the synthesized functional logic block (generated in block 54). For example, the mapping of the hardware description (e.g. RTL) for the test logic block may include using logic gates having the substantially same area and physical dimensions as the area and physical dimensions of the logic gates of the synthesized functional logic block. Therefore, the test logic block is again synthesized, but now it is known what area and dimensions are needed for the synthesized test logic block in order to be merged with the functional logic block. Note that the resulting synthesized test logic block may be referred to as a shared synthesized test logic block. The user-provided test logic constraints may be the same used in block 50, or may be modified prior to use in block 60. Also, in block 60, the synthesized test logic block is placed, which includes determining the physical placement within the semiconductor device (e.g. the physical placement in silicon) of the logic gates of the synthesized test logic block. This placing operation may result in physical coordinates being stored for each logic gate and sequential element of the synthesized test logic block, where the coordinates may be stored, for example, in secondary storage 16. Note that currently known methods may be used to perform the physical placement of the logic gates. Therefore, the synthesized test logic block having approximately the same area and dimensions as the synthesized functional logic block may allow for the two blocks to be superimposed for merging.

Flow then proceeds to block 62 where the synthesized functional logic block is merged with the synthesized test logic block to obtain a synthesized merged logic block. Details of the merging will be described in more detail in reference to FIG. 3 below. Therefore, the result of block 62 is a merged logic block. For example, a merged logic block may have the format of merged logic block 104 of FIG. 5. In merged logic block 104, sequential elements 108, 110, 112, 114, and 116 are shared by both the functional logic block and test logic block. That is, shared sequential elements 108, 110, 112, 114, and 116 are used to perform the functions of sequential elements 108, 110, 112, 114, and 116 of functional logic block 100 and of sequential elements 118, 120, 122, 124, and 126, respectively, of test logic block 102. Note that the shared sequential elements have two-to-one (2:1) multiplexers at the inputs so that during functional mode, they can receive the functional data inputs (represented, for example, by the inputs to sequential elements 108, 110, 112, 114, and 116, respectively, of functional logic block 100), and during test mode, they can receive the test data inputs (represented, for example, buy the inputs to sequential elements 118, 120, 122, 124, and 126, respectively, of test logic block 102). Also, the test combinational logic is physically moved into the functional logic block. In this manner, merged logic block 104 is used instead of both functional logic block 100 and test logic block 102.

From block 62, flow proceeds to block 64 where the synthesized merged logic block is legalized. Legalizing checks for any overlaps of the physical cells, such as the logic gates, and if any overlap exists, the legalizing changes the physical placement to correct the overlap. Known methods of legalization may be used to legalize the synthesized merged logic block.

Flow then proceeds to decision diamond 65 where it is determined whether there are any more test logic blocks to merge. If so, flow returns to block 44 where another test logic block is retrieved from RTL 24. If not, flow proceeds to block 66 where the resulting hardware description having at least one synthesized merged functional and test logic block is stored. The resulting hardware description may be stored, for example, in secondary storage 16 as synthesized merged logic 34. (Note also that throughout the description of flow 40, any synthesized test logic block and its physical placement information may be stored in secondary storage 16 as synthesized test logic 32 and any synthesized functional logic block and its physical placement information may be stored in secondary storage 16 as synthesized functional logic 30.) Flow then proceeds to block 67 where the resulting hardware description is used to manufacture a semiconductor device. Note that known semiconductor processing and manufacture techniques may be used to manufacture a semiconductor device using a hardware description. Flow then ends at end 68.

Figure 3:
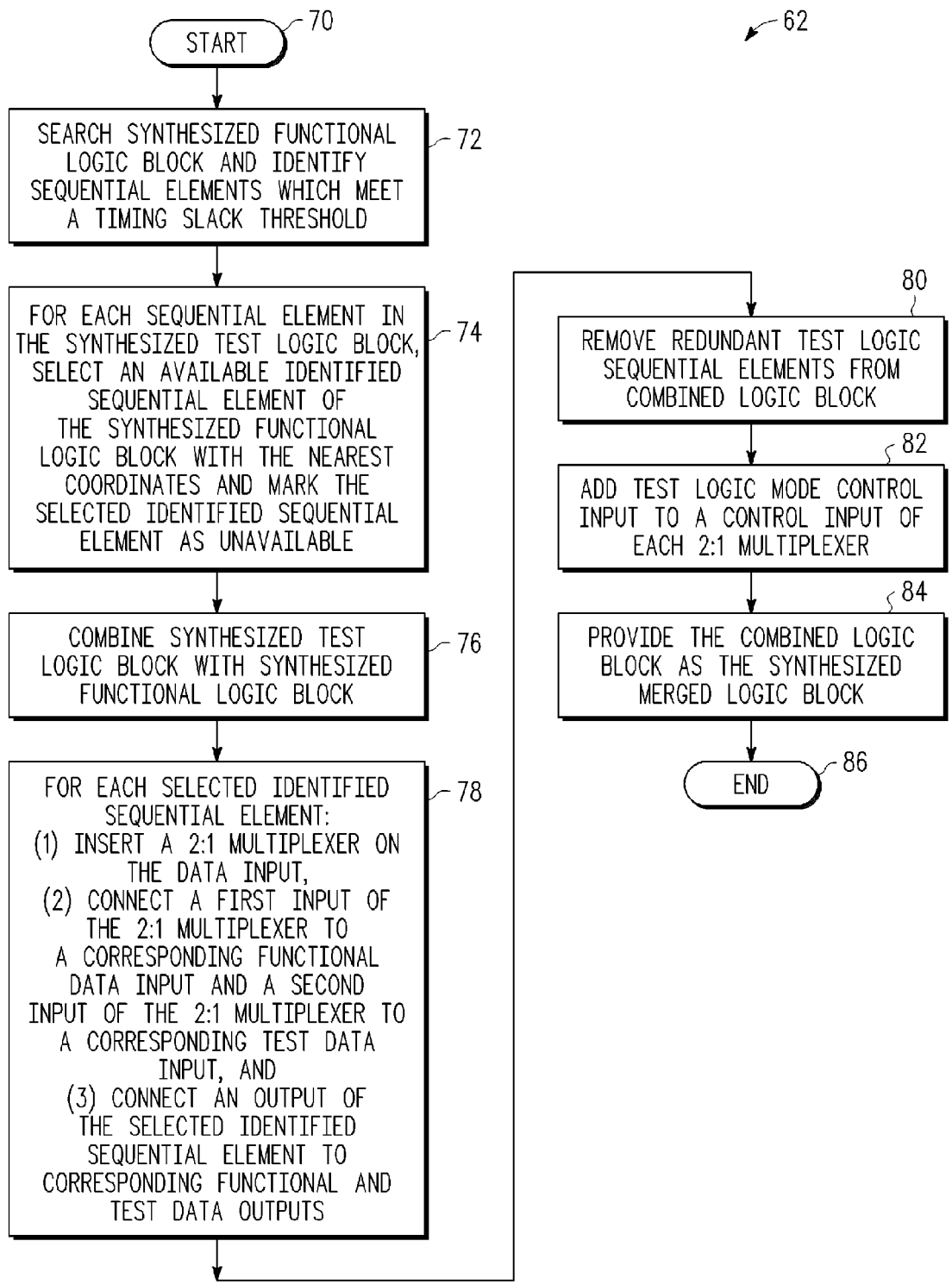

FIG. 3 illustrates and example flow for the merging performed in block 62 of FIG. 2. The flow of FIG. 3 begins with start 70 and proceeds to block 72 where the synthesized functional logic block (e.g. referring to the synthesized functional logic block available from block 54, after determining that the thresholds are met in decision diamond 56) is searched to identify the particular sequential elements which meet a timing slack threshold (and which can thus accommodate an additional multiplexer). The identified sequential elements can be tagged or flagged in a variety of ways. Flow then proceeds to block 74, where for each sequential element in the synthesized test logic block, an available identified sequential element of the synthesized functional logic block which has the nearest coordinates to the sequential element in the synthesized test logic block is selected. (Note that the physical coordinates for each sequential element in each of the synthesized test and functional logic block being merged may have been determined and stored during the placing operations performed in, for example, blocks 54 and 60 of flow 40.) The selected identified sequential element of the synthesized functional logic block is then marked as unavailable since it has already been selected for merging with a corresponding sequential element of the synthesized test logic block. For example, referring to FIG. 5, each of sequential elements 113, 108, 110, 111, 112, 114, and 116 in block 100 may be identified to meet the timing slack threshold. For a first sequential element in the synthesized test logic block, such as sequential element 118, sequential element 108 of functional logic block 100 may be selected since its physical coordinates are nearest to those of sequential element 118. Sequential element 108 may then be marked as no longer available since it has already been selected. This process is then repeated for each of sequential elements 120, 122, 124, and 126. Note that not all of sequential elements of functional logic block 100 may be available for merging since some may not meet the timing slack threshold. Furthermore, note that alternate algorithms or methods can be used to identify and select sequential elements in the synthesized test logic block and to identify and select corresponding elements in the functional logic block for merging.

After block 74, flow proceeds to block 76, where the synthesized test logic block is combined with the synthesized functional logic block. For example, in block 76, the connectivity and placement information, which can be represented in various design description formats, are physically combined, such that they are all contained in a single combined logic block. In one embodiment, the connectivity information can be provided by gate level netlists. Note that after this combination, all sequential elements, combinational elements and connectivity for each of the synthesized functional logic block and synthesized test logic block are present in the combined logic block.

Flow then proceeds to block 78 where, for each selected identified sequential element in the combined logic block, the following operations are performed: (1) a 2:1 multiplexer is inserted on the data input (these may correspond, for example, to multiplexers 128, 130, 132, 134, and 136 in merged logic block 104 of FIG. 5); (2) a first input of the 2:1 multiplexer is connected to a corresponding functional data input and a second input of the 2:1 multiplexer is connected to a corresponding test data input; and (3) an output of the selected identified sequential element is connected to corresponding functional and test data outputs. Therefore, as can be seen in merged logical block 104 of FIG. 5, each of multiplexers 128, 130, 132, 134, and 136 receive two inputs, one corresponding to the same functional data inputs as were received by sequential elements 108, 110, 112, 114, and 116, respectively, in functional logic block 100 and the other one corresponding to the same functional data inputs as were received by sequential elements 118, 120, 122, 124, and 126, respectively, in test logic block 102. Similarly, the outputs of sequential elements 108, 110, 112, 114, and 116 are provided to the same functional data outputs as sequential elements 108, 110, 112, 114, and 116, respectively, in functional logic block 100 and are provided to the same test data outputs as sequential elements 118, 120, 122, 124, and 126, respectively, in test logic block 102.

Therefore, in one embodiment, the operations of block 78 may include decoupling a functional logic input path from a data input of each of the plurality of identified sequential elements and decoupling a test logic input path from a data input of each of a plurality of sequential elements of the test logic block. For example, this may refer to decoupling the data input path from the data inputs of each of sequential elements 108, 110, 112, 114, and 116 of functional logic block 100 (where, for example, the data input paths for the data inputs of sequential elements 112, 114, and 116 are provided by functional combinational logic 106), and decoupling the data input paths from the data inputs of each of sequential elements 118, 120, 122, 124, and 126 of test logic block 102 (where, for example, the data input paths for the data inputs of sequential elements 122, 124, and 126 are provided by test combinational logic 107). The operations of block 78 may also include coupling an output of a 2:1 multiplexer to the data input of each of the plurality of identified sequential elements, coupling a first input of the 2:1 multiplexer to the corresponding decoupled functional logic input path of each of the plurality of identified sequential elements, and coupling a second input of the 2:1 multiplexer to the corresponding decoupled test logic input path of the plurality of sequential elements of the synthesized test logic block. For example, this may refer to coupling an output of multiplexers 128, 130, 132, 134, and 136 to the data input of sequential elements 108, 110, 132, 134, 136, respectively, coupling a first input of multiplexers 128, 130, 132, 134, and 136 to the corresponding decoupled functional logic input paths of sequential elements 108, 110, 112, 114, and 116 (where, for example, the first input of multiplexers 132, 134, and 136 are coupled to decoupled data input paths provided by functional combinational logic 106), and coupling a second input of multiplexers 128, 130, 132, 134, and 136 to the corresponding decoupled test logic input paths of sequential elements 118, 120, 122, 124, and 126 (where, for example, the second input of multiplexers 132, 134, and 136 are coupled to decoupled data input paths provided by test combinational logic 107). The operations of block 78 may also include decoupling a test logic output path form a data output of each of the plurality of sequential elements of the synthesized test logic block, and coupling an output of each of the plurality of identified sequential elements to the corresponding decoupled test logic output path. For example, this may refer to decoupling the data output path of sequential elements 118, 120, 122, 124, and 126, respectively, (where, for example, the data output paths of sequential elements 118 and 120 are provided by test combinational logic 107), and coupling an output of each of sequential elements 108, 110, 112, 114, and 116 to the decoupled data output path of sequential elements 118, 120, 122, 124, and 126 (where, for example, data outputs of sequential elements 108 and 110 are now also provided to test combinational logic 107 as well as functional combinational logic 106).

After block 78, flow proceeds to block 80 where the redundant test logic block sequential elements are removed from the combined logic block. That is, after block 76, the combined logic block includes all sequential elements from each of the synthesized functional and test logic blocks. However, since the functionality of each sequential element of the synthesized test logic block has been merged into corresponding sequential elements of the synthesized functional logic block as described in reference to block 78, the sequential elements of the synthesized test logic block are no longer needed. Therefore, in the example of FIG. 5, notes that sequential elements 118, 120, 122, 124, and 126 are not present in merged logic block 104.

After block 80, flow proceeds to block 82 where a test logic mode control signal is added to the combined logic block. The test logic mode control signal is provided to the control inputs of each of the 2:1 multiplexers added in block 78. In this manner, when the test logic mode control signal has a first value, a test mode is indicated where the test data inputs are routed to the sequential elements and the outputs of the sequential elements are routed to the test data outputs, such that the functionality of the test logic can be implemented. When the test logic mode control signal has a second value, a non-test mode (i.e. a functional mode) is indicated where the functional data inputs are routed to the sequential elements and the outputs of the sequential elements are routed to the functional data outputs, such that the functionality of the functional logic can be implemented.

After block 82, flow proceeds to block 84 where the combined logic block, having the multiplexers and the test logic mode control signal and without the redundant sequential elements, is provided as the synthesized merged logic block. For example, this block may have a format similar to that of merged logic block 104 of FIG. 5. The flow of FIG. 6 then ends at end 86.

Therefore, it can be appreciated how test logic blocks can be merged with functional logic blocks in order to achieve reduced die are of the semiconductor device. Note that, as discussed above, the flows of FIGS. 2 and 3 may be performed by EDA application 22. However, in alternate embodiments, the flows of FIGS. 2 and 3 can be performed by various different EDA applications, where different portions can be performed by different applications. These different EDA applications can all be executed by processor 12, or may be executed by different processors in different data processing systems.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The term "program," "code," or "software," as used herein, is defined as a sequence of instructions designed for execution on a computer system. A program (or computer program, code, software, etc.) may include a subroutine, a function, a procedure, an object method, an object implementation, an executable application, an applet, a servlet, a source code, an object code, a shared library/dynamic load library and/or other sequence of instructions designed for execution on a computer system.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 10 or device 90 are circuitry located on a single integrated circuit or within a same device. Alternatively, system 10 or device 90 may include any number of separate integrated circuits or separate devices interconnected with each other. Also for example, device 90 or system 10 or portions thereof may be soft or code representations of physical circuitry or of logical representations convertible into physical circuitry. As such, system 10 or device 90 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be received elements of system 10, for example, from computer readable media such as memory 14, secondary storage 16, or other media on other computer systems. Such computer readable media may be permanently, removably or remotely coupled to an information processing system such as system 10. The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

In one embodiment, system 10 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A processor-implemented method for making a semiconductor device having at least one test logic block and at least one functional logic block, the method comprising:

retrieving hardware description for the at least one test logic block and mapping the hardware description for the at least one test logic block to logic gates based on user constraints to generate at least one synthesized test logic block;

retrieving hardware description for the at least one functional logic block and mapping the hardware description for the at least one functional logic block to logic gates based on user constraints to generate at least one synthesized functional logic block; and merging the at least one synthesized test logic block with the at least one synthesized functional logic block to generate at least one merged synthesized logic block, when the at least one functional logic block meets at least one criterion for selection as a candidate for merger with the at least one test logic block and using the at least one merged synthesized logic block in manufacturing the semiconductor device, wherein determining whether the at least one functional logic block meets the at least one criterion for selection as a candidate for merger with the at least one test logic block comprises determining whether a number of sequential elements of the at least one functional logic block is within a predetermined threshold of a number of sequential elements of the at least one test logic block.

2. The processor-implemented method of claim 1 further comprising mapping the hardware description for the at least one test logic block to logic gates based on user constraints to generate a first synthesized test logic block and modifying user constraints for the at least one functional logic block based on the first synthesized test logic block.

3. The processor-implemented method of claim 2 further comprising mapping the hardware description for the at least one functional logic block to logic gates based on the modified user constraints to generate at least one modified synthesized functional logic block and determining a physical placement of the at least one modified synthesized functional logic block within the semiconductor device.

4. The processor-implemented method of claim 3 further comprising mapping the hardware description for the at least one test logic block to logic gates based on the user constraints to generate a second synthesized test logic block, wherein mapping further comprises using logic gates having substantially same area as an area of the logic gates and having substantially same physical dimensions as physical dimensions of the logic gates for the at least one modified synthesized functional logic block and determining a physical placement of the second synthesized test logic block within the semiconductor device.

5. The processor-implemented method of claim 4 further comprising merging the at least one modified synthesized functional logic block with the second synthesized test logic block to obtain a second merged synthesized logic block and using the second merged synthesized logic block in manufacturing the semiconductor device.

6. A processor-implemented method for obtaining at least one merged synthesized logic block for use in making a semiconductor device having at least one test logic block and at least one functional logic block, the method comprising:

retrieving hardware description for the at least one test logic block and mapping the hardware description for the at least one test logic block to logic gates based on user constraints to generate at least one synthesized test logic block;

retrieving hardware description for the at least one functional logic block and mapping the hardware description for the at least one functional logic block to logic gates based on user constraints to generate at least one synthesized functional logic block;

determining, by a processor, whether the at least one functional logic block meets at least one criterion for selection as a candidate for merger with the at least one test logic block; and when the at least one functional logic block meets the at least one criterion for selection as the candidate for merger, then merging, by the processor, the at least one synthesized functional logic with the at least one synthesized test logic block to obtain the at least one merged synthesized logic block, wherein merging further comprises:

identifying a plurality of sequential elements corresponding to the at least one synthesized functional logic block that satisfy a timing slack threshold, and selecting a plurality of sequential elements from the plurality of identified sequential elements for shared use with the at least one synthesized test logic block, wherein the method further comprises modifying the user constraints for the at least one functional logic block based on the at least one synthesized test logic block.

7. The processor-implemented method of claim 6, wherein selecting the plurality of sequential elements from the identified plurality of sequential elements for shared use with the at least one synthesized test logic block further comprises:

for each sequential element corresponding to the at least one synthesized test logic block, selecting a sequential element within the at least one synthesized functional logic having coordinates nearest to one of the plurality of identified sequential elements.

8. The processor-implemented method of claim 6, wherein determining whether the at least one functional logic block meets the at least one criterion for selection as a candidate for merger with the at least one test logic block comprises determining whether a number of sequential elements of the at least one functional logic block is within a predetermined threshold of a number of sequential elements of the at least one test logic block.

9. The processor-implemented method of claim 6, wherein merging further comprises:

decoupling a functional logic input path from a data input of each of the plurality of identified sequential elements;

decoupling a test logic input path from a data input of each of a plurality of sequential elements of the at least one test logic block;

coupling an output of a 2:1 multiplexer to the data input of each of the plurality of identified sequential elements;

coupling a first input of the 2:1 multiplexer to the corresponding decoupled functional logic input path of each of the plurality of identified sequential elements;

coupling a second input of the 2:1 multiplexer to the corresponding decoupled test logic input path of the plurality of sequential elements of the at least one test logic block;

decoupling a test logic output path from a data output of each of a plurality of sequential elements of the at least one test logic block; and coupling an output of each of the plurality of identified sequential elements to the corresponding decoupled test logic output path.

10. The processor-implemented method of claim 9 further comprising removing redundant sequential elements corresponding to the at least one test logic block from the at least one synthesized merged logic block.

11. The processor-implemented method of claim 9 further comprising coupling a test logic mode control input to a control input of the 2:1 multiplexer, such that when the test logic mode control input is asserted, the 2:1 multiplexer couples the second input of the 2:1 multiplexer to the output of the 2:1 multiplexer.

12. The processor-implemented method of claim 6, wherein mapping the hardware description for the at least one functional logic block to logic gates to generate the at least one synthesized functional logic block comprises mapping based on the modified user constraints and determining a physical placement of the at least one synthesized functional logic block within the semiconductor device.

13. The processor-implemented method of claim 12 further comprising mapping the hardware description for the at least one test logic block to logic gates based on the user constraints to generate at least one shared synthesized test logic block, wherein mapping further comprises using logic gates having substantially same area as an area of the logic gates and having substantially same physical dimensions as physical dimensions of the logic gates for the at least one synthesized functional logic block and determining a physical placement of the at least one shared synthesized test logic block within the semiconductor device.

14. The processor-implemented method of claim 6 further comprising using the at least one synthesized merged logic block in manufacturing the semiconductor device.

15. An apparatus for obtaining at least one merged synthesized logic block for making a semiconductor device having at least one test logic block and at least one functional logic block, the apparatus comprising:

a memory comprising an electronic design automation application;

a secondary storage comprising:

hardware description for the at least one functional logic block, hardware description for the at least one test logic block, first synthesis constraints for the at least one test logic block and second synthesis constraints for the at least one functional logic block; and a processor for executing the electronic design automation application, the electronic design automation application executing the steps of:

retrieving hardware description for the at least one test logic block and mapping the hardware description for the at least one test logic block to logic gates based on the first synthesis constraints to generate at least one synthesized test logic block, retrieving hardware description for the at least one functional logic block and mapping the hardware description for the at least one functional logic block to logic gates based on the second synthesis constraints to generate at least one synthesized functional logic block, determining whether the at least one functional logic block meets at least one criterion for selection as a candidate for merger with the at least one test logic block, wherein determining whether the at least one functional logic block meets the at least one criterion for selection as a candidate for merger with the at least one test logic block comprises determining whether a number of sequential elements of the at least one functional logic block is within a predetermined threshold of a number of sequential elements of the at least one test logic block and when the at least one functional logic block meets the at least one criterion for selection as the candidate for merger, then merging the least one synthesized functional logic with the at least one shared synthesized test logic block to obtain at least one merged synthesized logic block.

16. The apparatus of claim 15, wherein merging further comprises:
   identifying a plurality of sequential elements corresponding to the at least one synthesized functional logic block that satisfy a timing slack threshold, and
   selecting a plurality of sequential elements from the plurality of identified sequential elements for shared use with the at least one synthesized test logic block.

17. The apparatus of claim 16, wherein merging further comprises:
   for each of the plurality of identified sequential elements:
      decoupling a functional logic input path from a data input of each of the plurality of identified sequential elements;
      decoupling a test logic input path from a data input of each of a plurality of sequential elements of the at least one test logic block;
      coupling an output of a 2:1 multiplexer to the data input of each of the plurality of identified sequential elements;
      coupling a first input of the 2:1 multiplexer to the corresponding decoupled functional logic input path of each of the plurality of identified sequential elements;
      coupling a second input of the 2:1 multiplexer to the corresponding decoupled test logic input path of the plurality of sequential elements of the at least one test logic block;
      decoupling a test logic output path from a data output of each of a plurality of sequential elements of the at least one test logic block; and
      coupling an output of each of the plurality of identified sequential elements to the corresponding decoupled test logic output path.

* * * * *